United States Patent [19]
Kobayashi

[11] Patent Number: 4,943,947
[45] Date of Patent: Jul. 24, 1990

[54] SEMICONDUCTOR MEMORY DEVICE WITH AN IMPROVED SERIAL ADDRESSING STRUCTURE

[75] Inventor: Yasuaki Kobayashi, Tokyo, Japan

[73] Assignee: NEC Corporation, Tokyo, Japan

[21] Appl. No.: 242,446

[22] Filed: Sep. 9, 1988

[30] Foreign Application Priority Data

Sep. 9, 1987 [JP] Japan .............................. 62-227178

[51] Int. Cl.$^5$ .............................................. G11C 7/02
[52] U.S. Cl. .......................... 365/189.12; 365/230.03; 365/240
[58] Field of Search ................... 365/240, 239, 189.12, 365/230.06, 221, 231, 230.03

[56] References Cited

U.S. PATENT DOCUMENTS

| | | | |
|---|---|---|---|
| 4,395,764 | 7/1983 | Matsue | 365/189.12 X |
| 4,429,375 | 1/1984 | Kobayashi et al. | 365/240 |
| 4,688,197 | 8/1987 | Novak et al. | 365/230.03 X |
| 4,796,224 | 1/1989 | Kawai et al. | 365/189.12 X |
| 4,802,134 | 1/1989 | Tsujimoto | 365/240 X |

*Primary Examiner*—James W. Moffitt
*Attorney, Agent, or Firm*—Sughrue, Mion, Zinn, Macpeak & Seas

[57] ABSTRACT

A serially addressing type memory integrated circuit with an improved shift register operable at a high speed and fabricated on a reduced area of chip, is disclosed and featured in that the shift register has a plurality of first stages connected in cascade and arranged from a first location to a second location and a plurality of second stages connected in cascade and arranged from the second location to the first location and the first and second stages are alternately arranged one by one, and that an access detection circuit for indicating an access to an approximately center of serial addresses is connected to one of the first and second stages near the second location.

6 Claims, 4 Drawing Sheets

SEMICONDUCTOR MEMORY DEVICE WITH AN IMPROVED SERIAL ADDRESSING STRUCTURE

BACKGROUND OF THE INVENTION

1. Field of the Invention

The present invention relates to a semiconductor memory device fabricated on a semiconductor chip, and more particularly to a memory device provided with a serial addressing circuit for serially reading a plurality of bit locations without address information which is externally applied.

2. Description of the Related Arts

Many kinds of memories have been developed and used widely in accordance with purposes and applications. Among those memories, a memory having a large capacity is advantageously used in a system processing large amount of data such as those for images or voices.

The memory of this kind is not required to operate at a very high speed, but to be fabricated at low cost. Therefore, a memory of serially addressing type has been proposed to minimize the number of external pins so as to reduce the cost.

Since such a memory having a large memory capacity has a wide address space which requires a large address bit length. This makes it necessary to use a great number of address terminals if the conventional address access system is adopted. On the other hand, the image or voice data stored in a memory are practically read out not in an arbitrary order but in a predetermined order. The data are stored in a row in the order to be read-out. Thus, the stored data can be read-out in the order by repeatedly addressing the columns in the order. This sequential addressing can be achieved by using a shift register or a counter to generate successive column addresses. Thus, a plurality bits of data stored in bit lines are sequentially read out one by one by incrementing or decrementing contents of the shift register without using a large number of column address terminals for receiving the column address.

Since the memory device of this kind does not need the large number of address terminals, it can be fabricated at a low cost and used easily. However, in the memory of this kind, it is difficult to know which column is being accessed from the outside of the memory. It is sometimes required to detect or predict the timing point when the sequential access through the columns of the selected row (word) is completed, for selecting a subsequent row or another memory in an interleaved manner at a high speed. Under the above circumstance, it has been proposed to provide in the memory a detection circuit for detecting the access to a predetermined one column other than the last column, e.g. a central column. For this detection, a stage in the shift register corresponding to the predetermined column is connected to the detection circuit through a connection wire. A detection output of the detection circuit is, in turn, applied to a memory controller.

In the above system using the detection circuit, the shift stage corresponding to the central column locates at a central portion of the shift register remote from the last stage of the shift register. Since the memory device has the shift register interposed between two planes of memory element matrices to control the column lines, the detection device cannot be disposed near the central stage but is positioned at; an area near the last stage. Therefore, the wiring from the central stage to the detection circuit is inevitably long, causing an accompany of large stray capacitance. The large stray capacitance causes a time delay on a signal to be transmitted, resulted in a delay of detection. This delay in detection limits the high speed operation of the memory device. Moreover, the large stray capacitance weakens the signal to be transmitted to lose the reliability of operation of the detection.

SUMMARY OF THE INVENTION

It is an object of the present invention to provide a serially addressing type semiconductor memory device which can be fabricated on a reduced-size semiconductor chip at a high density.

It is another object of the present invention a provide a serially addressing type semiconductor memory which can generate a detection signal indicating the access to a predetermined column at a high speed.

The semiconductor memory device according to the present invention comprises two memory arrays of memory cells arranged in rows and columns, a row selection circuit for selecting one of the rows of the memory array, a serial selection circuit interposed between the two memory arrays for selecting columns of the array one by one, the serial selection circuit including a shift register having first to N-th stages (N being a positive integer more than 2) in which a selective level is shifted from the first stage to the N-th stage one by one, and an access detection circuit coupled to M-th stage of the shift register (M being a positive integer equal or close to N/2) for producing a detection signal when the M-th stage of the shift register becomes the selective level. The memory according to the present invention is featured in that the first to the M-th (or M-1 th) stages and the M+1 th (or M-th) stage to the N-th stage are alternately disposed from a first side to a second side of the columns.

According to the present invention, the M-th stage of the shift register is located near the mentioned second side of the columns and the access detection circuit is also positioned near the second side of the columns. Therefore, a length of a wiring between the M-th stage and the access detection circuit can be effectively shortened.

Thus, according to the present invention an area occupied by the wiring between the M-th stage and the access detection circuit is reduced, and a signal delay from the selection of the M-th stage to the generation of the detection signal is also reduced. The signal applied to the access detection circuit is not weakened to obtain a reliable control of the memory array.

BRIEF DESCRIPTION OF THE DRAWINGS

The above and further objects, features and advantages of the present invention will become more apparent from the following detailed description taken in conjunction with the accompanying drawings, wherein.

DETAILED DESCRIPTION OF THE INVENTION

The serially addressing type memory device in the prior art will be explained with reference to FIG. 1.

A memory cell array 1 includes a plurality of memory cells MC arranged in "K" rows and "N" columns (K and N being positive integers more than 2). A plurality of word lines $WL_1$-$WL_K$ are arranged in rows and a plurality of pairs of bit lines $d_1$, $\bar{d}_1/$ -$d_N$, $\bar{d}_N/$ are arranged in the array 1. A plurality of sense amplifiers $SA_1$-$SA_N$ coupled to the pairs of bit lines are provided in a sense amplifier block 2. A row decoder 3 selects one of the word lines in accordance with row address information. A data register section 4 is composed of "N" data holding circuits $D_1$ to $D_n$ having input ends coupled to "N" pairs of bit lines $d_1$, $\bar{d}_1/$ to $d_N$, $\bar{d}_N/$, respectively. Each data holding circuit, e.g. $D_1$ operatively holds data on the pair of bit lines $d_1$, $\bar{d}_1/$ when data is developed thereon. A pair of output ends of each data holding circuit are coupled to a pair of bus lines I/O and $\bar{I}/$ through each pair of transfer gate transistors ($Q_{1A}$, $Q_{1B}$ to $Q_{NA}$, $Q_{NB}$), as illustrated.

The pair of bus lines I/O and $\bar{I}/$ are connected to a pair of input ends of an output or input/output circuit 6 coupled to a data output terminal DT.

A shift register 5 has "N" shift stages $R_1$ to $R_N$ and shifts a single selection signal rightwards one by one in synchronism with clock pulses $\phi_1$ and $\bar{\phi}_1$.

Driver transistors $Q_{t1}$ to $Q_{tN}$ serve as source-follower transistors for driving the plurality of pairs of transfer gate transistors $Q_{1A}$, $Q_{1B}$ to $Q_{NA}$, $Q_{NB}$, respectively in accordance with the state of the shift register 5, when a drive pulse $\phi_2$ is activated. The pulses $\phi_1$ and $\phi_2$ are activated alternately.

The row decoder 3 selects one of the word lines to read data in parallel from "N" memory cells connected to the selected word lines on the "N" pairs of bit lines so that the read-out data are set in the register 4. The data thus set in the register 4 are transferred one bit by one bit to the terminal DT through the pair of bus lines I/O, $\bar{I}/$ and the circuit 6 in synchronism with the pulses $\phi_1$.

For example, the stage $R_1$ of the first column address $C_1$ is first selected so that the pair of transfer gate transistors $Q_{1A}$ and $Q_{1B}$ are rendered conductive by way of the conductive drive transistor $Q_{t1}$ in response to the active level of the clock pulse $\phi_2$. Subsequently, the selective level of the stage $R_1$ at the column address $C_1$ is shifted to the stage $R_2$ of a second column address $C_2$ in response to the activation of the clock pulse $\phi_1$ and then, in response to the activation of the clock pulse $\phi_2$, data stored in the stage $D_2$ of the register 4 is outputted to the terminal DT.

Thus, by repeating the activation of the clock pulses $\phi_1$ and $\phi_2$ alternately, the column, addresses $C_3 \ldots C_M \ldots C_N$ defined in the shift register 5 are sequentially selected to read data corresponding to the selected column addresses one by one in synchronism with the clock pulses $\phi_1$ and $\phi_2$.

Since the selection of the columns is sequentially performed by way of the clock pulses $\phi_1$ and $\phi_2$ without necessitating any column address information, it is difficult to know the location of the selected column from the outside of the memory.

For solving the above problem, an address detection circuit 7 which may be a buffer circuit, is provided. An input end of the detection circuit 7 is connected to the gates of the pair of transfer gate transistors $Q_{MA}$ and $Q_{MB}$ which correspond to a center location ($C_M$) of the column addresses which are serially accessed. When the stage $C_M$ of the shift register 5 is selected and the gates of the pair of transistors $Q_{MA}$ and $Q_{MB}$ are made at the selective level, the detection circuit 7 generates at an external terminal a detection signal indicating that the center column address location $C_M$ is instantly accessed. Alternatively, the address detection circuit may be directly connected to the central stage $C_M$ of the shift register 5 to detect the selective level thereof.

Since the detection circuit 7 and the terminal AT are formed on a periphery portion of the memory chip and therefore a wiring 21 connected between the gates of the transistors $Q_{MA}$ and $Q_{MB}$ (a source of the drive transistor $Q_{tM}$) and the input end of the detection circuit 7 has inevitably a large length. Therefore, an area occupied by the wiring 21 is relatively large and adversely affects a large integration of the memory chip. Moreover, a signal delay through the wiring is also large because of the large length of the wiring 22. Thus, it has been difficult to produce; the detection signal at a high speed.

Also, it should be noted that the output of the last stage $C_N$ of the shift register 5 is feed back to the input end of the first stage $C_1$ via a feed back wiring 22. This wiring 22 has also a large length and occupies a large area on the memory chip. In addition, because of the large length of the wiring 22, a feed back time for feeding back the output of the last stage $C_N$ of the shift register 5 to the first stage $C_1$ is large, resulting a low speed operation of the shift register 5.

Figure 2:
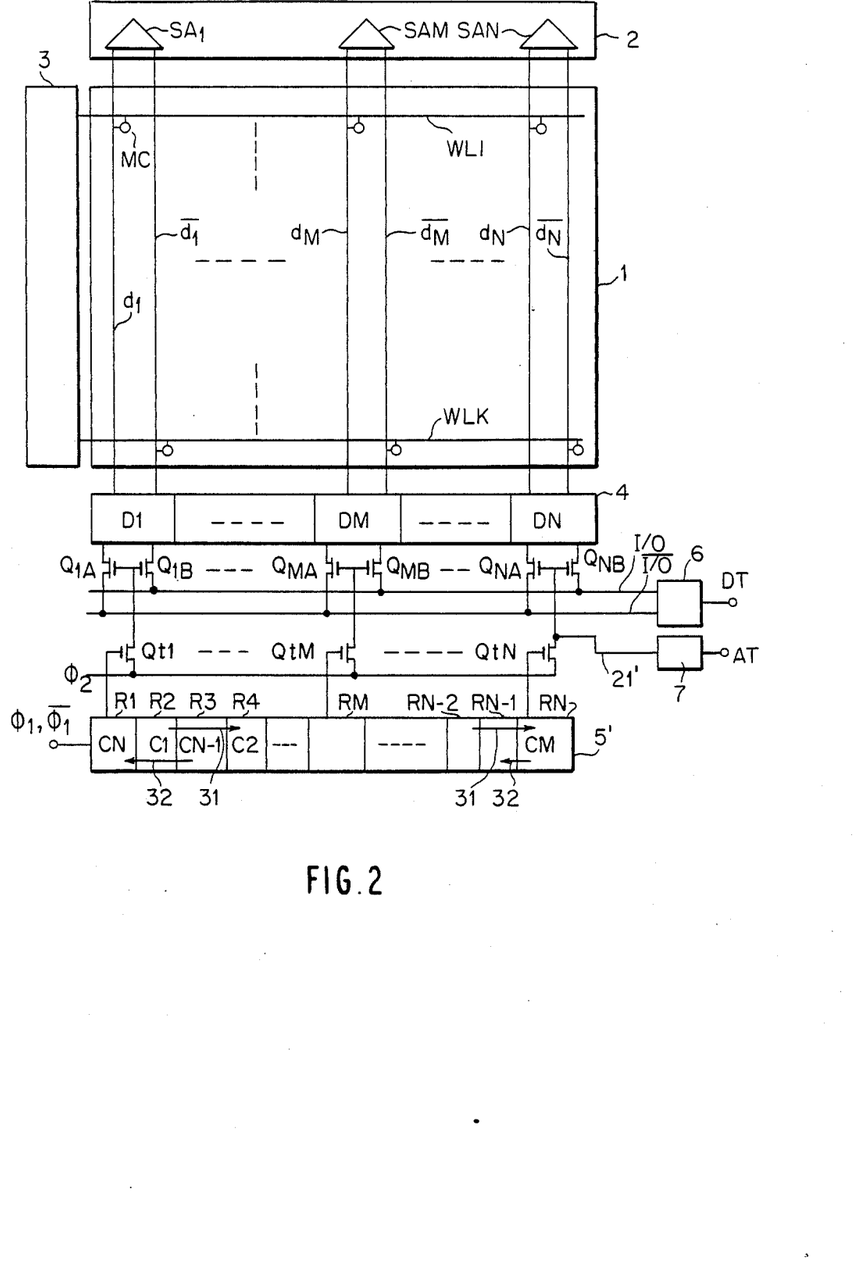
FIG. 2 is a schematic block diagram showing a memory integrated circuit according to a first embodiment of the present invention.
Figure 3A:
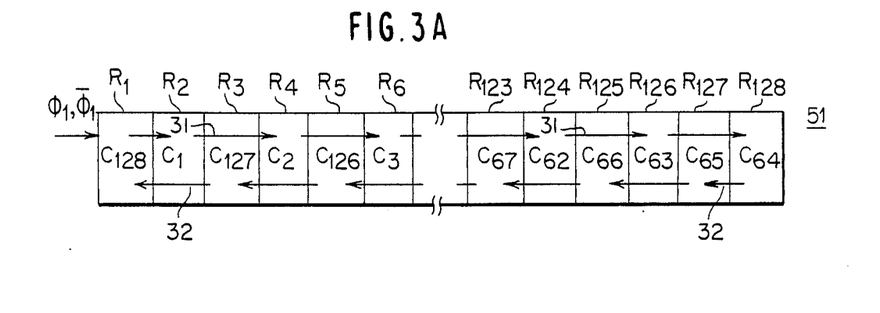
FIG. 3A and FIG. 3B are schematic block diagrams showing shift operations and inter-stage wirings of the shift register employed in the memory integrated circuit of FIG. 2, respectively.
Figure 3B:
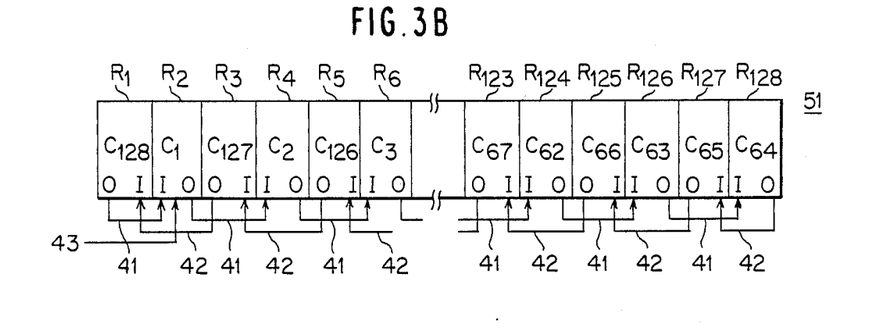
Figure 4:
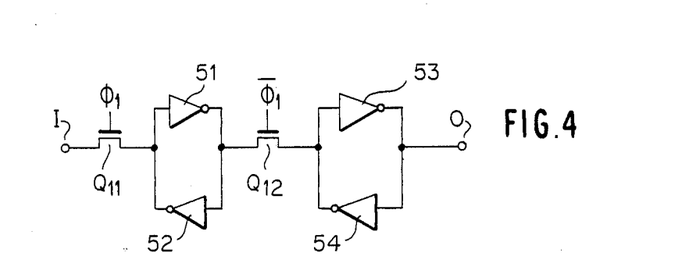
FIG. 4 is a schematic block diagram of each stage of the shift register.

With reference to FIGS. 2 to 4, the memory integrated circuit according to one embodiment of the present invention will be explained.

Figure 1:
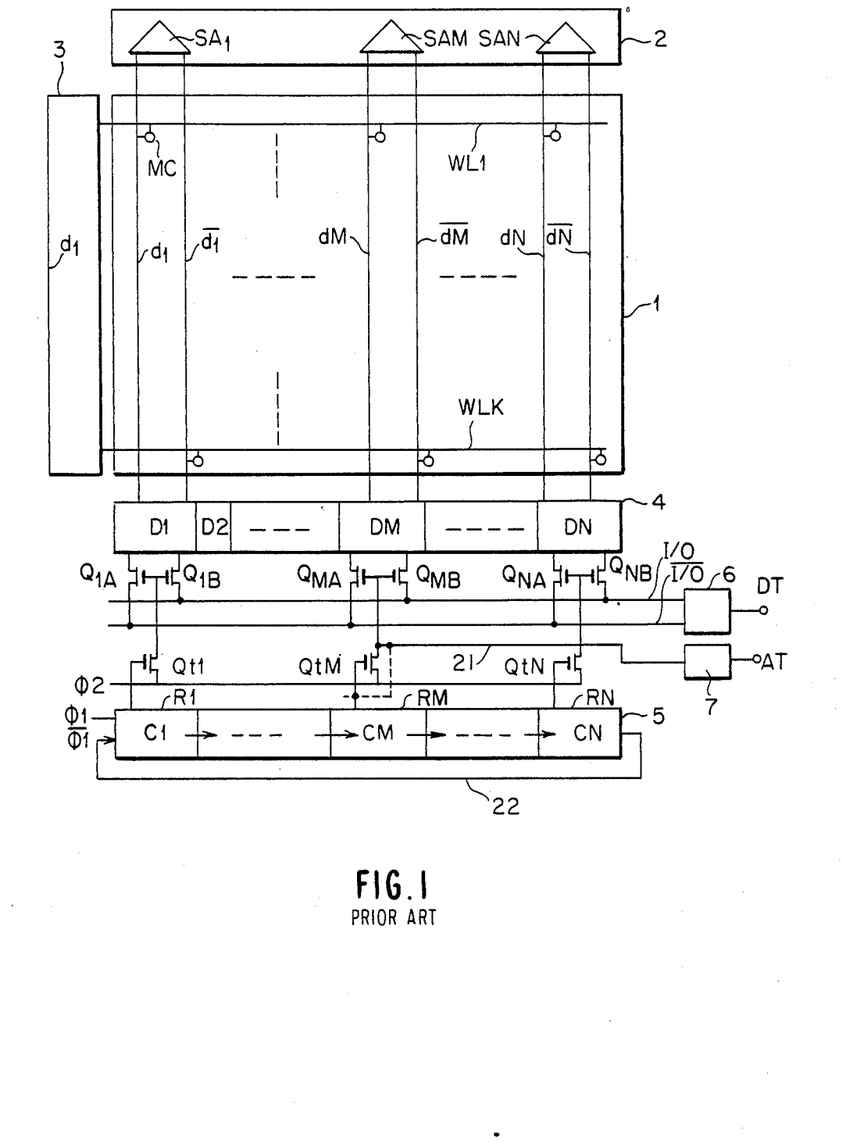
FIG. 1 is a schematic block diagram showing a memory integrated circuit in the prior art.

In FIG. 2, the portions or elements corresponding to those in FIG. 1 are denoted by the same or similar references.

The memory integrated circuit according to the present embodiment is featured in that the input end of the detection circuit 7 such as a buffer circuit is connected to the source of the drive transistor $Q_{tN}$ associated with the right side column (Nth column) through a wiring 21' and a shift register 5' is employed in place of the shift register 5 in FIG. 1.

The shift register 5' has "N" stages $R_1$ to $R_N$ similarly to the shift register 5. However, shift operations of the shift register 5' is quite different from those of the shift register 5 in FIG. 1.

Namely, even numbers of the stages $R_2$, $R_4$, $R_6 \ldots R_{N-2}$ and $R_N$ are assigned to the serial column addresses $C_1$, $C_2$, $C_3 \ldots$ and $C_M$ and the selective level is shifted from the stage $R_2$ to the stage $R_4$ and further to be shifted rightward even number stages $R_6$, $R_8 \ldots R_{N-2}$ and $R_N$ one by one as shown by arrows 31 in synchronism with the repetition of the clock pulses $\phi_1$. After the selection of the stage $R_n$, the selective level is shifted from the stage $R_N$ to odd number stages $R_{N-1}$, $R_{N-3}$, $R_{N-5}$, $\ldots R_3$, and $R_1$ one by one as shown by arrows 32 in synchronism with the activation of the clock pulses $\phi_1$. Thus, the serial column addresses $C_1$, $C_2$, $C_3 \ldots C_M$, $C_{M+1} \ldots C_N$ are sequentially selected by the outputs of the even number stages $R_2$, $R_4 \ldots R_N$ and the odd number stages $R_{N-1}$, $R_{N-3} \ldots R_3$ and $R_1$, as illustrated.

FIG. 3A illustrates data flow in the shift register 5' in the case where the number "N" of the shift stages is 128.

The selective level is held by the stage $R_2$ corresponding to the serial column address $C_1$ at first. Then, as shown by the arrow 31 the selective level is shifted from the stage $R_2$ to the stage $R_4$ in response to the activation of the clock pulse $\phi_1$ and then further shifted to the stages $R_6$, $R_8$ ... $R_{124}$, $R_{126}$ and $R_{128}$ in synchronism with the repetitive activation of the clock pulse $\phi_1$ one by one so that the serial column addresses $C_1$ to $C_{64}$ are sequentially accessed.

After the selection of the stage $R_{128}$ (the column address $C_{64}$) is done, the selective level is shifted from the stage $R_{128}$ to the stage $R_{127}$ as shown by the arrow 32 and further shifted to the stages $R_{125}$, $R_{123}$ ... $R_5$, $R_3$ and $R_1$ one by one in synchronism with the respective activation of the clock pulse $\phi_1$. After the selection of the last column address $C_{128}$, the first column address $C_1$ is selected and the above cyclic operations are repeated.

FIG. 3B shows inter-stage wiring structure of the shift register 5'. The even number of the stages $R_2$, $R_4$, $R_6$ ... $R_{126}$ and $R_{128}$ are connected in cascade with respect to output ends O and input ends I thereof through wirings 41. The stage $R_{128}$ and the odd number of stages $R_{127}$, $R_{125}$ ... $R_5$, $R_3$ and $R_1$ are connected in cascade leftward with respect to output ends O and input ends I thereof through wirings 42, as illustrated. The output end O of the stage $R_1$ corresponding to the last column address $C_{128}$ is connected to the input end I of the stage $R_2$ corresponding to the first column address $C_1$ to form a close loop. But, if such a close loop is not necessary, the connection between the output end O of the stage $R_1$ to the input end I of the stage $R_2$ may be omitted.

If the selection of the column addresses is always started from the column address $C_1$, a wiring 43 is connected to the stage $R_2$ for initially making it selective, in a known way.

An example of the structure of the stages $R_1$–$R_{128}$ of the shift register 5' is shown in FIG. 4. Inverters 51 and 52 form a first flip-flop and inverters 53 and 54 form a second flip-flop. A transfer gate transistor $Q_{11}$ is connected between the input end I and the first flip-flop (51, 52) and a transfer gate transistor $Q_{12}$ is connected between the first and second flip-flops. The transistor $Q_{11}$ writes data at the input end I to the first flip-flop in response to the clock pulse $\phi_1$ and the transistor $Q_{12}$ establishes the state at the output end in response to a clock pulse $\overline{\phi_1}$ opposite to $\phi_1$.

As is seen from FIG. 3B, the even number of the stages ($R_2$, $R_4$, $R_6$ ... $R_{126}$ and $R_{128}$) are connected cascade while the odd number of the stages $R_{127}$, $R_{125}$, $R_{123}$ ... $R_3$ and $R_1$) are also connected in cascade. The respective wirings 41 and 42 have substantially the same length corresponding to a width of each stage, while there is no such a long wiring (corresponding to the wiring 22 in FIG. 1) that runs from one end to the other end of the shift register.

Therefore, an effective operation speed of the shift register is increased as well as generating the detection signal at a high speed.

In the memory of FIG. 2, the physical locations of the column addresses $C_1$ to $C_N$ ($C_{128}$) are different from the structure of FIG. 1. However, in the serially addressing memory, the order of writing data to the column addresses and the order of reading data from the column addresses are same and therefore no problem occurs in this respect.

Figure 5:
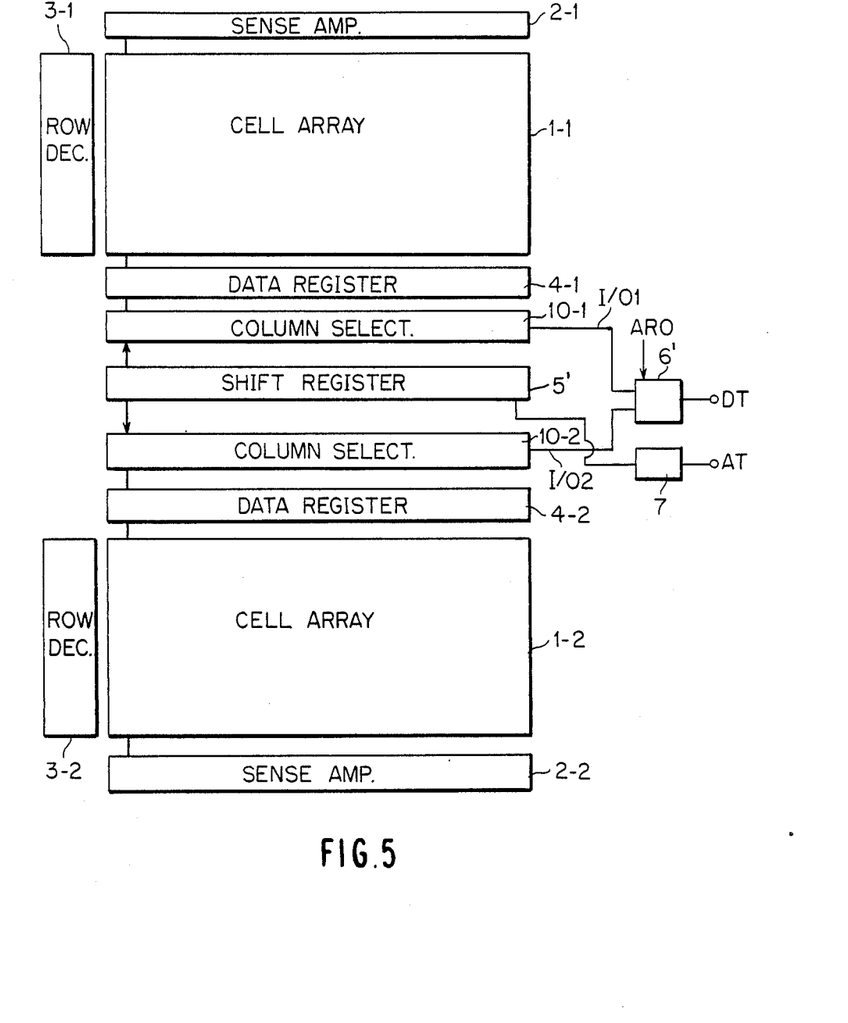
FIG. 5 is a schematic block diagram of a memory integrated circuit according to a second embodiment of the present invention.

A memory integrated circuit according to another embodiment will be explained with reference to FIG. 5.

In this embodiment, the memory cell array 1, the sense amplifier block 2, the row decoder 3, the data register 4 and the column selection circuit 10 which includes the pairs of transfer gate transistors $Q_{1A}$, $R_{1B}$–$Q_{NA}$, $Q_{NB}$, the drive transistors $Q_{t1}$ to $Q_{tN}$ and the bus line I/O, are divided into their two parts 1-1, 1-2; 2-1, 2-2; 3-1, 3-2; 4-1, 4-2; and 10-1, 10-2, respectively. The shift register 5' such as one shown in FIG. 3B is arranged between the two column selection circuits and used to control the column selection circuits 10-1 and 10-2 at the same time. Namely, the row decoders 3-1 and 3-2 receives the same row address information and operate in parallel so that one of the word lines is selected in each of the arrays 1-1 and 1-2. Therefore, the data registers 4-1 and 4-2 receive read out data from the arrays 1-1 and 1-2 and hold them, respectively. The data stored in the data registers 4-1 and 4-2 are sequentially selected by way of the shift register 5' and sequentially outputted to the bus lines I/O 1 and I/O 2 in parallel. The output circuit 6' receives one bit of row address signal $AR_0$ and selectively outputs data stored in the data register 4-1 or the data register 4-2 to the terminal DT.

As has been explained by way of the embodiments, the memory integrated circuit according to the present invention is advantageous in the high integration structure and the high speed serial access operations.

The present invention is also applicable to any type of memories such as a static memory and a read only memory, and variety type of shift registers are utilized as the shift register 5', in the invention.

I claim:

1. A semiconductor memory comprising; first to M-th data holding circuits arranged in a first direction, each of said data holding circuits storing digital information, a common data line, first to M-th selection circuits coupled between said plurality of data holding circuits and said common data line, respectively, an output circuit having an input end coupled to said common data line, a serial addressing circuit for serially applying a selection signal to said selection circuits, said serial addressing circuit including a shift register having first to M-th (M being a positive integer more than 2) shift stages arranged in said first direction, said first to M-th shift stages being alternately classified into first and second groups, the shift stages of said first group being electrically connected in cascade for operation in such manner that said selection signal is consecutively shifted towards said M-th shift stage in said first direction only through the shift stages of said first group, the shift stages of said second group being electrically connected in cascade for operation in such manner that said selection signal is consecutively shifted from said M-th shift stage towards said first stage only through the shift stages of said second group in a second direction opposite to said first direction, and means for transferring said selection signal from one of said first and second shift stages to the other of said first and second stages.

2. The semiconductor memory according to claim 1, further comprising a detection circuit means coupled to said M-th shift stage for detecting that said selection signal is shifted to said M-th shift stage.

3. The semiconductor memory according to claim 1, in which each of said selection circuits includes a transfer gate coupled between the associated data holding circuit and said common data line.

4. A semiconductor memory comprising a plurality of word lines, a plurality of bit lines intersecting said word lines, a plurality of memory cells coupled to said word lines and said bit lines, a row selection circuit for selecting one of said word lines, first to M-th data holding circuits arranged in a first direction, means for connecting said bit lines to said data holding circuits in parallel, a common data line, first to M-th data transfer circuits coupled between said first to M-th data holding circuits and said common data line, a serial selection circuit for serially applying a selection signal to said data transfer circuits one by one, said serial selection circuit including a shift register having first to M-th (M being a positive integer more than 2) shift stages arranged in said first direction, said first M-th shift stages being alternately classified into first and second groups, the shift stages of said first group being electrically connected in cascade such that said selection signal is consecutively shifted towards said M-th shift stage only through the shift stages in said first group in said first direction, the shift stages in said second group being electrically connected in cascade such that said selection signal is consecutively shifted from said M-th shift stages in a second direction opposite to said first direction only through the shift stages of said second group, means for connecting an output end of one of the first and second shift stages to an input end of the other of said first and second shift stages, and a detection circuit connected to said M-th shift stage, said direction circuit detecting when said selection signal is shifted to said M-th shift stage.

5. The semiconductor memory according to claim 4, in which the odd numbered shift stages are classified into said first group and the even numbered shift stages are classified into said second group.

6. The semiconductor memory according to claim 4, in which each of said data transfer circuits includes a field effect transistor having a source-drain path connected between an associated data holding circuit and said common data line.

* * * * *

UNITED STATES PATENT AND TRADEMARK OFFICE
CERTIFICATE OF CORRECTION

PATENT NO. : 4,943,947
DATED : July 24, 1990
INVENTOR(S) : Yasuaki KOBAYASHI

It is certified that error appears in the above-identified patent and that said Letters Patent is hereby corrected as shown below:

Col. 2, line 14, delete "a", insert --to--.

Col. 3, line 13, delete "$d_1$, $\overline{d_1}$/ -$d_N$, $\overline{d_N}$/", insert --$d_1$, $\overline{d_1}$ -$d_N$, $\overline{d_N}$ --;

Col. 3, line 20, delete "$d_1$, $\overline{d_1}$/ to $d_N$, $\overline{d_N}$/", insert --$d_1$. $\overline{d_1}$ to $d_N$, $\overline{d_N}$ --;

Col. 3, line 22, delete "$d_1$, $\overline{d_1}$/", insert --$d_1$, $\overline{d_1}$ --;

Col. 3, line 25, delete "$\overline{I}$/", insert --$\overline{I/O}$--;

Col. 3, line 27, delete "$\overline{I}$/", insert --$\overline{I/O}$--;

Col. 3, line 32, delete "$\phi_1$, and $\phi_1$", insert --$\phi_1$, and $\overline{\phi_1}$--;

Col. 3, line 45, delete "$\overline{I}$/", insert --$\overline{I/O}$--.

Col. 4, lines 20 and 21, delete "occuplied" and insert --occupied--;

Col. 4, line 61, delete "$R_n$" and insert --$R_N$--.

UNITED STATES PATENT AND TRADEMARK OFFICE
CERTIFICATE OF CORRECTION

PATENT NO. : 4,943,947

DATED : July 24, 1990

INVENTOR(S) : Yasuaki Kobayashi

It is certified that error appears in the above-identified patent and that said Letters Patent is hereby corrected as shown below:

Col. 5, line 51, delete first occurrence of "$\phi_1$", insert --$\overline{\phi_1}$--.

Signed and Sealed this

Eighteenth Day of February, 1992

Attest:

HARRY F. MANBECK, JR.

*Attesting Officer*      *Commissioner of Patents and Trademarks*